United States Patent
Hanekawa et al.

(10) Patent No.: US 11,150,550 B2
(45) Date of Patent: *Oct. 19, 2021

(54) REFLECTIVE MASK BLANK AND REFLECTIVE MASK

(71) Applicant: AGC INC., Chiyoda-ku (JP)

(72) Inventors: Hiroshi Hanekawa, Tokyo (JP); Tsuyoshi Kakuta, Tokyo (JP); Yoichi Sera, Tokyo (JP); Sadatatsu Ikeda, Tokyo (JP)

(73) Assignee: AGC INC., Chiyoda-ku (JP)

( * ) Notice: Subject to any disclaimer, the term of this patent is extended or adjusted under 35 U.S.C. 154(b) by 124 days.

This patent is subject to a terminal disclaimer.

(21) Appl. No.: 16/056,786

(22) Filed: Aug. 7, 2018

(65) Prior Publication Data

US 2019/0049836 A1    Feb. 14, 2019

(30) Foreign Application Priority Data

Aug. 10, 2017 (JP) .............................. JP2017-155403
Sep. 22, 2017 (JP) .............................. JP2017-182146

(51) Int. Cl.
*G03F 1/24* (2012.01)
*G03F 1/48* (2012.01)
*G03F 1/52* (2012.01)
*G03F 1/54* (2012.01)

(52) U.S. Cl.
CPC ................. *G03F 1/24* (2013.01); *G03F 1/48* (2013.01); *G03F 1/52* (2013.01); *G03F 1/54* (2013.01)

(58) Field of Classification Search
CPC ..... G03F 1/24; G03F 1/48; G03F 1/54; G03F 1/52

See application file for complete search history.

(56) References Cited

U.S. PATENT DOCUMENTS

| | | | |
|---|---|---|---|
| 10,241,390 B2* | 3/2019 | Hanekawa | ............... G03F 1/54 |
| 2005/0208389 A1 | 9/2005 | Ishibashi et al. | |
| 2008/0248409 A1 | 10/2008 | Ishibashi et al. | |
| 2010/0266938 A1* | 10/2010 | Hosoya | .................. B82Y 10/00 430/5 |
| 2011/0217633 A1 | 9/2011 | Hosoya | |

(Continued)

FOREIGN PATENT DOCUMENTS

| | | |
|---|---|---|
| JP | 3806702 | 8/2006 |
| JP | 2010-206156 | 9/2010 |

(Continued)

OTHER PUBLICATIONS

Machine translation of JP 2015-142083 (Aug. 2015).*
Machine translation of Jp 2016-046370 (Apr. 2016).*

*Primary Examiner* — Martin J Angebranndt
(74) *Attorney, Agent, or Firm* — Oblon, McClelland, Maier & Neustadt, L.L.P.

(57) ABSTRACT

A reflective mask blank includes, on/above a substrate in the following order from the substrate side a multilayer reflective film which reflects EUV light and an absorber film which absorbs EUV light. The absorber film is a tantalum-based material film containing a tantalum-based material. The absorber film provides a peak derived from the tantalum-based material in an X-ray diffraction pattern, the peak having a peak diffraction angle (2θ) of 36.8 degrees or more and a full width at half maximum of 1.5 degrees or more.

10 Claims, 2 Drawing Sheets

(56) References Cited

U.S. PATENT DOCUMENTS

| | | | |
|---|---|---|---|
| 2011/0281207 A1 | 11/2011 | Hosoya | |
| 2012/0322000 A1* | 12/2012 | Uno | G03F 1/24 |
| | | | 430/5 |
| 2013/0071779 A1 | 3/2013 | Hosoya | |
| 2013/0122407 A1 | 5/2013 | Hashimoto et al. | |
| 2014/0011122 A1 | 1/2014 | Hosoya | |
| 2014/0212794 A1* | 7/2014 | Maeshige | G03F 1/24 |
| | | | 430/5 |
| 2017/0242330 A1* | 8/2017 | Hanekawa | G03F 1/54 |

FOREIGN PATENT DOCUMENTS

| | | | | |
|---|---|---|---|---|
| JP | 2012-033715 | | 2/2012 | |
| JP | 5507876 | | 5/2014 | |
| JP | 2015-084447 | | 4/2015 | |
| JP | 2015-142083 | * | 8/2015 | G03F 1/24 |
| JP | 2016-046370 | | 4/2016 | |
| WO | WO 2010/074125 A1 | | 7/2010 | |
| WO | WO 2010/090132 A1 | | 8/2010 | |

* cited by examiner

REFLECTIVE MASK BLANK AND REFLECTIVE MASK

BACKGROUND OF THE INVENTION

Technical Field

The present invention relates to a reflective mask blank to be used in semiconductor manufacturing or the like, and a reflective mask obtained by forming a pattern in an absorber film of the reflective mask blank.

Background Art

In semiconductor industry, a photolithography method using visible light or ultraviolet light has been used as a fine pattern transfer technique necessary for forming an integrated circuit including a fine pattern on a Si substrate or the like. However, fining of semiconductor devices is accelerating, but a limit of a conventional photolithography method has been approached. In the photolithography method, a resolution limit of a pattern is about ½ of an exposure wavelength, and it has been said that the resolution limit of the pattern is about ¼ of the exposure wavelength even when an immersion method is used, and the limit is expected to be about 45 nm even when an immersion method with ArF laser (193 nm) is used. Therefore, EUV (Extreme Ultra Violet) lithography which is an exposure technique using EUV light of a wavelength shorter than ArF laser is promising as an exposure technique of 45 nm or shorter. In the specification, the EUV light refers to light of a wavelength in a soft X-ray region or a vacuum ultraviolet region, and specifically refers to light of a wavelength of about 10 nm to 20 nm, particularly about 13.5 nm±0.3 nm.

Since the EUV light is easy to be absorbed by many substances and a refractive index of the substance at this wavelength is close to 1, a refractive optical system such as photolithography using conventional visible light or ultraviolet light cannot be used. Therefore, in EUV optical lithography, a reflective optical system, that is, a reflective photomask and a mirror are used.

A reflective mask blank is a laminated body before patterning, which is used for manufacturing a reflective photomask, and has a structure in which a reflective layer which reflects EUV light and an absorber film which absorbs EUV light are sequentially formed on/above a substrate such as glass.

A multilayer reflective film in which a low-refractive-index layer with a low refractive index to the EUV light and a high-refractive-index layer with a high refractive index to the EUV light are alternately laminated so as to increase light reflectance when a layer surface is irradiated with the EUV light, is usually used as the reflective layer. A molybdenum (Mo) layer is usually used as the low-refractive-index layer of the multilayer reflective film, and a silicon (Si) layer is usually used as the high-refractive-index layer.

A material with a high absorption coefficient to the EUV light, specifically, for example, a material containing tantalum (Ta) as a main component is used in the absorber film (see Patent Literatures 1 to 5).

Patent Literature 1: Japanese Patent No. 5507876
Patent Literature 2: JP-A-2012-33715
Patent Literature 3: JP-A-2015-84447
Patent Literature 4: JP-A-2010-206156
Patent Literature 5: Japanese Patent No. 3806702

SUMMARY OF THE INVENTION

When manufacturing the reflective photomask from the mask blank, a desired pattern is formed in the absorber film of the mask blank. When forming the pattern in the absorber film, an etching process, usually a dry etching process, is used. It is preferable to have a sufficient etching rate during the dry etching process, which can improve etching selectivity during pattern formation. When the etching selectivity is improved, time required for patterning is shortened, productivity is improved, and damage to the multilayer reflective film by the etching process is reduced.

An object of the present invention is to provide a reflective mask blank including an absorber film having a sufficient etching rate during dry etching process, and a reflective mask.

As a result of intensive studies to achieve the above object, the present inventors have found that, in a case where a crystalline state of an absorber film containing Ta and nitrogen (N) was kept in a specific state, a sufficient etching rate can be achieved during the dry etching process.

The present invention has been made based on the above findings, and provides a reflective mask blank including, on/above a substrate in the following order from the substrate side: a multilayer reflective film which reflects EUV light and an absorber film which absorbs EUV light, wherein the absorber film is a tantalum-based material film containing a tantalum-based material, and wherein the absorber film provides a peak derived from a tantalum-based material in an X-ray diffraction pattern, the peak having a peak diffraction angle 2θ of 36.8 degrees or more and a full width at half maximum of 1.5 degrees or more.

In the reflective mask blank, the tantalum-based material film preferably contains 10.0 at % to 35.0 at % of nitrogen atoms.

In the reflective mask blank, the tantalum-based material film preferably contains 0.05 at % or more of Krypton atoms.

It is preferred that the reflective mask blank includes a protective film on the multilayer reflective film, wherein etching selectivity between the absorber film and the protective film is 45 or more in a dry etching process with a chlorine gas.

In the reflective mask blank, the protective film is preferably a ruthenium-based material film containing a ruthenium-based material.

Further, the present invention provides a reflective mask obtained by forming a pattern in the absorber film of the reflective mask blank.

Since the reflective mask blank includes the absorber film capable of having a sufficient etching rate during the dry etching process, the etching selectivity during the pattern formation is improved.

DETAILED DESCRIPTION OF THE INVENTION

Hereinafter, a reflective mask blank of the present invention will be described with reference to the drawings.

Figure 1:
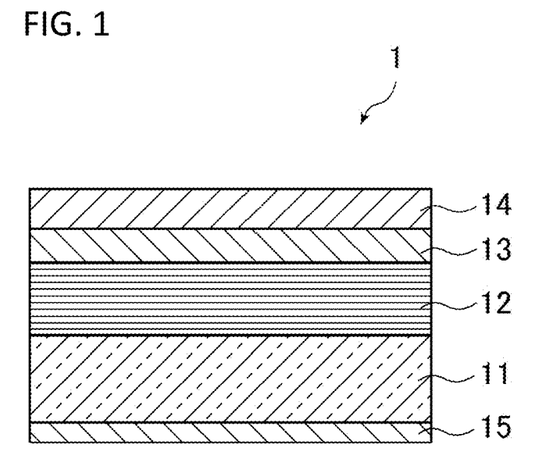
FIG. 1 is a schematic cross-sectional view of a reflective mask blank in one embodiment of the present invention.

FIG. 1 is a schematic cross-sectional view of a reflective mask blank in one embodiment of the present invention. In a reflective mask blank 1 shown in FIG. 1, a multilayer reflective film 12 which reflects EUV light and an absorber film 14 which absorbs EUV light are formed on/above a substrate 11 in this order. A protective film 13 for protecting the multilayer reflective film 12 during pattern formation on the absorber film 14 is formed between the multilayer reflective film 12 and the absorber film 14. A backside conductive film 15 is formed on a back surface side of the substrate 11, that is, a surface side opposite to a surface on/above which the multilayer reflective film 12, the protective film 13, and the absorber film 14 are formed.

Hereinafter, each constituent element of the mask blank is described.

In the reflective mask blank, in the constituent shown in FIG. 1, only the substrate 11, the multilayer reflective film 12 and the absorber film 14 are essential elements, and the protective film 13 and the backside conductive film 15 are optional elements.

Hereinafter, each constituent element of the reflective mask blank 1 is described.

The substrate 11 is required to satisfy properties as a substrate for a reflective mask blank. Therefore, it is preferable that the substrate 11 has a low coefficient of thermal expansion (specifically, the coefficient of thermal expansion at 20° C. is preferably $0\pm0.05\times10^{-7}/°$ C., particularly preferably $0\pm0.03\times10^{-7}/°$ C.), and has excellent smoothness, flatness, and resistance to a cleaning solution used for washing the mask blank or photomask after pattern formation. Specifically, glass having a low coefficient of thermal expansion, for example, $SiO_2$—$TiO_2$ based glass or the like is used as the substrate 11, but the present invention is not limited thereto, and crystallized glass having precipitated β-quartz solid solution, quartz glass, silicon or metal can be used.

It is preferable that the substrate 11 has a smooth surface with a surface roughness (rms) of 0.15 nm or less and flatness of 100 nm or less, since high reflectance and high transfer accuracy in the reflective photomask after pattern formation can be obtained.

A size, thickness, or the like of the substrate 11 are determined appropriately depending on design values of a mask or the like. In Example to be described later, $SiO_2$—$TiO_2$ based glass with a 6 inches (152 mm) square in outer dimensions and a thickness of 0.25 inch (6.3 mm) was used.

It is preferable to have no defect on a surface of the substrate 11 on the side where the multilayer reflective film 12 is formed. However, even in a case where there are defects, in order to prevent occurrence of a phase defect due to a concave defect and/or a convex defect, it is preferable that a depth of the concave defect and a height of the convex defect are 2 nm or less, and a full width at half maximum of the concave defect and convex defect is 60 nm or less.

The multilayer reflective film 12 can have a high EUV light reflectance by laminating alternately a high-refractive-index layer and a low-refractive-index layer for a plurality of times. In the multilayer reflective film 12, Mo is widely used in the low-refractive-index layer, and Si is widely used in the high-refractive-index layer. That is, a Mo/Si multilayer reflective film is the most commonly used. However, the multilayer reflective film is not limited thereto, and a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film and a Si/Ru/Mo/Ru multilayer reflective film can also be used.

The multilayer reflective film 12 is not particularly limited as long as it has desired properties as the multilayer reflective film of the reflective mask blank. Here, the properties particularly required for the multilayer reflective film 12 is high EUV light reflectance. Specifically, when a surface of the multilayer reflective film 12 is irradiated with light in a wavelength region of the EUV light at an incident angle of 6 degrees, a maximum value of the light reflectance around a wavelength of 13.5 nm is preferably 60% or more, and more preferably 65% or more. Further, even in a case where the protective film 13 is placed on the multilayer reflective film 12, a maximum value of the light reflectance around a wavelength of 13.5 nm is preferably 60% or more, and more preferably 65% or more.

A film thickness of each layer constituting the multilayer reflective film 12 and a number of repeating units of the layer can be appropriately selected depending on a film material to be used and the EUV light reflectance required for the multilayer reflective film. Taking a Mo/Si reflective film as an example, in order to obtain the reflective layer 12 with the maximum EUV light reflectance of 60% or more, the multilayer reflective film may be formed by laminating a Mo layer with a film thickness of 2.3±0.1 nm and a Si layer with a film thickness of 4.5±0.1 nm and satisfying the number of repeating units of 30 to 60.

Each layer constituting the multilayer reflective film 12 may be formed to have a desired thickness by use of known deposition methods such as a magnetron sputtering method and an ion beam sputtering method. For example, in a case of forming a Si/Mo multilayer reflective film by use of an ion beam sputtering method, it is preferable that a Si film is formed to have a thickness of 4.5 nm by using a Si target as a target, and using Ar gas as sputtering gas (gas pressure: $1.3\times10^{-2}$ Pa to $2.7\times10^{-2}$ Pa) at an ion acceleration voltage of 300 V to 1500 V and a deposition rate of 1.8 nm/min to 18 nm/min; and then, a Mo film is formed to have a thickness of 2.3 nm by using a Mo target as a target, and using Ar gas as sputtering gas (gas pressure: $1.3\times10^{-2}$ Pa to $2.7\times10^{-2}$ Pa) at an ion acceleration voltage of 300 V to 1500 V and a deposition rate of 1.8 nm/min to 18 nm/min. When the above formation procedure is taken as one cycle, the Si/Mo multilayer reflective film is formed by laminating the Si film and the Mo film in 40 to 50 cycles.

In order to prevent a surface of the multilayer reflective film 12 from being oxidized, it is preferable that the uppermost layer of the multilayer reflective film 12 is a layer of a material which is difficult to be oxidized. The layer of a material which is difficult to be oxidized functions as a cap layer of the multilayer reflective film 12. A Si layer is exemplified as a specific example of the layer which functions as the cap layer and is formed of a material difficult to be oxidized. In a case where the multilayer reflective film 12 is a Si/Mo film, the uppermost layer can function as a cap layer by using a Si layer as the uppermost layer. In that case, it is preferable that a film thickness of the cap layer is 11±2 nm.

The protective film 13 is an optional constituent element that is provided for a purpose of protecting the multilayer reflective film 12 such that the multilayer reflective film 12 is not damaged by an etching process when the absorber film 14 is patterned by the etching process, usually a dry etching process. However, from the view point of protecting the multilayer reflective film 12, it is preferable to form the protective film 13 on the multilayer reflective film 12.

A substance which is difficult to be affected by the etching process for the absorber film 14, that is, a substance in which an etching rate thereof is smaller than that of the absorber film 14 and which is difficult to be damaged by the etching process, is selected as a material of the protective film 13.

Further, in order not to impair the EUV reflectance in the multilayer reflective film 12 even after the protective film 13 is formed, it is preferable to select a substance with a high EUV reflectance as the protective film 13.

It is preferable that the protective film 13 is a ruthenium-based material film containing a ruthenium-based material. In the specification, the term of "ruthenium-based material" refers to Ru and Ru compounds (e.g., RuB, RuSi, etc.). An amount of Ru in the ruthenium-based material film is preferably 50 at % or more, more preferably 70 at % or more, still more preferably 90 at % or more, and particularly preferably 95 at % or more.

In a case of forming the protective film 13 on the multilayer reflective film 12, it is preferable that a thickness of the protective film 13 is 1 nm to 10 nm for reasons of increasing the EUV reflectance and obtaining the satisfactory etching resistance. The thickness of the protective film 13 is preferably 1 nm to 5 nm, and more preferably 2 nm to 4 nm.

In a case of forming the protective film 13 on the multilayer reflective film 12, the protective film 13 can be formed by known deposition methods such as a magnetron sputtering method and an ion beam sputtering method.

In a case of using an ion beam sputtering method to form a Ru film as the protective film 13, a Ru target may be used as a target and may be discharged under an argon (Ar) atmosphere. Specifically, the ion beam sputtering may be performed under the following conditions:

Sputtering Gas: Ar (gas pressure: $1.3 \times 10^{-2}$ Pa to $2.7 \times 10^{-2}$ Pa)

Ion Acceleration Voltage: 300 V to 1500 V

Deposition Rate: 1.8 nm/min to 18.0 nm/min

As the property particularly required for the absorber film 14, extremely low EUV reflectance thereof is exemplified. Specifically, when a surface of the absorber film 14 is irradiated with light in a wavelength region of the EUV light, a maximum light reflectance around a wavelength of 13.5 nm is preferably 2.0% or less, more preferably 1.0% or less, still more preferably 0.5% or less, and particularly preferably 0.1% or less.

In order to achieve the above properties, the absorber film 14 is formed of a material with a high absorption coefficient of EUV light. In the reflective mask blank 1, a tantalum-based material film containing a tantalum-based material is used as a material which has a high absorption coefficient of EUV light and is used for forming the absorber film 14. The reason why the tantalum-based material film is used is that the material is chemically stable, the material is easy to be etched during pattern formation of the absorber film, and the like. In the specification, the term of "tantalum-based material" refers to tantalum (Ta) and Ta compounds.

It is preferable that the tantalum-based material film contains Ta and nitrogen (N), since crystallization of Ta can be prevented and the crystal can be prevented from becoming larger and increasing the surface roughness.

In a case where the tantalum-based material film contains Ta and N, in order to achieve the later-described conditions in an X-ray diffraction pattern of the absorber film 14 and to increase the etching selectivity, an amount of N atoms is preferably 10.0 at % to 35.0 at %, more preferably 10.0 at % to 25.0 at %, still more preferably 10.5 at % to 18.0 at %, and particularly preferably 11.0 at % to 16.0 at %.

In a case where the tantalum-based material film contains Ta and N, the tantalum-based material film may further contain at least one element selected from hafnium (Hf), silicon (Si), zirconium (Zr), titanium (Ti), germanium (Ge), boron (B), tin (Sn), nickel (Ni), cobalt (Co) and hydrogen (H). In a case of containing these elements, a total content ratio thereof in the tantalum-based material film is preferably 10 at % or less.

The absorber film 14 which is a tantalum-based material film has a peak derived from the tantalum-based material in the X-ray diffraction pattern. In the reflective mask blank 1, when the peak derived from the tantalum-based material satisfies the Conditions 1 and 2 shown below, the etching rate is sufficient during the dry etching process.

Condition 1: A peak diffraction angle 2θ of the peak is 36.8 degrees or more

Condition 2: A full width at half maximum of the peak is 1.5 degrees or less

In the specification, the full width at half maximum is also referred to as FWHM.

In a case where the peak diffraction angle 2θ of the peak is less than 36.8 degrees, a ratio of amorphous phase in a crystalline phase increases and the etching rate during the dry etching process decreases. Meanwhile, when the peak diffraction angle 2θ is 36.8 degrees or more, a mixed phase state of an amorphous phase and a microcrystalline phase in a crystalline phase becomes appropriate and etching proceeds easily at a phase interface, so that the etching rate increases.

The peak diffraction angle 2θ of the peak is preferably in a range of 36.8 degrees to 40.0 degrees, and more preferably in a range of 37.0 degrees to 39.0 degrees.

In a case where the full width at half maximum of the peak is less than 1.5 degrees, crystallinity of the tantalum-based material film increases, so that coarse crystal grains are formed on a surface of the tantalum-based material film. The coarse crystal grains on the surface of the tantalum-based material film may be detected as adhered foreign matters during defect inspection, it becomes difficult to distinguish the coarse crystal grains from adhered foreign matters which should be originally inspected, and accuracy of defect inspection may be lowered. Further, it may be difficult to uniformly etch the absorber film and the surface roughness after etching may be rough.

The full width at half maximum of the peak is preferably 2.5 degrees to 6 degrees, and more preferably 3.0 degrees to 5.0 degrees.

The absorber film 14 satisfying the Conditions 1 and 2 described above has a sufficient etching rate during the dry etching process, and the etching selectivity between the absorber film and the multilayer reflective film (in a case where no protective film is formed on the multilayer reflective film) or the protective film (in a case where the protective film is formed on the multilayer reflective film) increases. For example, an etching rate during the dry etching process using chlorine-based gas as etching gas is fast, and etching selectivity between the absorber film and the protective film 13 is 45 or more. In the specification, the etching selectivity can be calculated using, for example, the following formula.

Etching Selectivity=(Etching Rate of Absorber Film 14)/(Etching Rate of Protective Film 13)

The etching selectivity during the dry etching process using the chlorine-based gas as the etching gas is preferably 45 or more, more preferably 50 or more, still more preferably 55 or more, and particularly preferably 60 or more. In addition, the etching selectivity is preferably 250 or less, and more preferably 100 or less.

A film thickness of the absorber film 14 is preferably 5 nm or more, more preferably 20 nm or more, still more preferably 30 nm or more, and particularly preferably 35 nm or more.

Meanwhile, when the film thickness of the absorber film 14 is too large, accuracy of a pattern to be formed in the absorber film 14 may decrease, so that the film thickness is preferably 100 nm or less, more preferably 90 nm or less, and still more preferably 80 nm or less.

The film thickness of the absorber film 14 can be reduced by use of a principle of phase shift or by including elements with a high absorption coefficient (e.g. Sn, Ni, Co, or the like) in the absorber film 14.

The absorber film 14 can be formed by known deposition methods such as sputtering methods, for example, the magnetron sputtering method and the ion beam sputtering method.

In a case of forming a TaN layer as the absorber film 14, when the magnetron sputtering method is used, a TaN layer can be formed by using a Ta target and discharging the target under a nitrogen ($N_2$) atmosphere diluted with Ar.

In order to form the TaN layer as the absorber film 14 by the method described above, specifically, the method may be performed under the following deposition conditions.

Sputtering Gas: mixed gas of rare gas and $N_2$ ($N_2$ gas concentration: 3 vol % to 80 vol %, preferably 5 vol % to 30 vol %, and more preferably 8 vol % to 15 vol %; gas pressure: $0.5 \times 10^{-1}$ Pa to $10 \times 10^{-1}$ Pa, preferably $0.5 \times 10^{-1}$ Pa to $5 \times 10^{-1}$ Pa, and more preferably $0.5 \times 10^{-1}$ Pa to $3 \times 10^{-1}$ Pa).

Input Power (for each target): 30 W to 2000 W, preferably 50 W to 1500 W, and more preferably 80 W to 1000 W.

Deposition Rate: 2.0 nm/min to 60 nm/min, preferably 3.5 nm/min to 45 nm/min, and more preferably 5 nm/min to 30 nm/min.

It is preferable to use krypton (Kr) as the rare gas in the sputtering gas, since film distortion during formation of the absorber film 14 can be prevented and deformation of the substrate can be avoided.

The absorber film 14 formed by using krypton (Kr) as the rare gas in the sputtering gas contains 0.05 at % or more of Kr atoms. The upper limit of krypton (Kr) atoms is preferably 1%, and more preferably 0.3%.

Electrical conductivity and a thickness of a constituent material are selected for the backside conductive film 15, so as to make sheet resistance thereof to be 100 Ω/square or less. The constituent material of the backside conductive film 15 can be widely selected from those described in known documents. For example, examples of the constituent material include high dielectric constant material layers described in JP-A-2003-501823 and WO-A1-2008/072706, specifically, a material layer selected from the group consisting of silicon, TiN, molybdenum, chromium (Cr), CrN, and TaSi. The backside conductive film can be formed by, specifically, for example, sputtering methods such as the magnetron sputtering method and the ion beam sputtering method, and dry deposition methods such as a CVD method and a vacuum vapor deposition method. For example, in a case where a CrN film is formed by the magnetron sputtering method, the magnetron sputtering may be performed by setting a target to be a Cr target and setting a sputtering gas to be a mixed gas of Ar and $N_2$. Specifically, the method may be performed under the following deposition conditions.

Target: Cr target

Sputtering Gas: mixed gas of Ar and $N_2$ ($N_2$ gas concentration: 10 vol % to 80 vol %, and gas pressure: 0.02 Pa to 5 Pa).

Input Power: 30 W to 2000 W

Deposition Rate: 2.0 nm/min to 60 nm/min

The reflective mask blank may have other constituent elements excluding those described above. For example, a low reflective layer or a hard mask may be formed for inspection light which is used for inspecting a mask pattern on/above the absorber film.

Examples of the low reflective layer include materials containing at least one element of Ta, Hf, Si, Zr, Ti, Ge, B, Sn, Ni, Co, N, H, and O, for example, TaO, TaON, TaONH, TaHfO, TaHfON, or the like.

Examples of the material of the hard mask layer include materials containing at least one element of Cr, Ru, Zr, In, Si, N, H, and O, for example, CrN, CrON, Ru, $SiO_2$, SiON, $Si_3N_4$, SiC, or the like Examples The present invention is described below along Examples.
Cases 1 to 5 are working examples, and Cases 6 and 7 are comparative examples.
(Case 1)
The reflective mask blank was manufactured by the following method.

First, a glass substrate ($SiO_2$—$TiO_2$-based glass substrate) with a length of 152.4 mm, a width of 152.4 mm, and a thickness of 6.3 mm was prepared as the substrate.

The glass substrate has a coefficient of thermal expansion of $0.2 \times 10^{-7}$/° C., a Young's modulus of 67 GPa, a Poisson's ratio of 0.17, and a specific rigidity of $3.07 \times 10^7$ m$^2$/s$^2$. The glass substrate was polished such that a main surface thereof has a surface roughness (root mean square height Sq) of 0.15 nm or less and flatness of 100 nm or less.

Next, a backside conductive film was formed on one surface (a second main surface) of the glass substrate. The backside conductive film was a CrN film and was formed to have a thickness of about 100 nm by the magnetron sputtering method. Sheet resistance of the backside conductive film is 100 Ω/square.

Next, an electrostatic chuck was used to fix the glass substrate in a deposition chamber in an electrostatic adsorption way via the backside conductive film. In this state, a multilayer reflective film was formed on a first main surface of the glass substrate.

In the deposition, a Mo/Si multilayer reflective film was formed by use of the ion beam sputtering method to alternately form an Mo layer with a thickness of 2.3 nm and an Si layer with a thickness of 4.5 nm for 50 times.

In the deposition of the Mo layer, the ion beam sputtering was performed using a Mo target under an Ar gas atmosphere (gas pressure: 0.02 Pa). An applied voltage was set to 700 V, and a deposition rate was set to 3.84 nm/min.

Meanwhile, in the deposition of the Si layer, the ion beam sputtering was performed using a boron-doped Si target under an Ar gas atmosphere (gas pressure: 0.02 Pa). An applied voltage was set to 700 V, and a deposition rate was set to 4.62 nm/min.

A total thickness (target value) of the multilayer reflective film is (2.3 nm+4.5 nm)×50 times=340 nm. The uppermost layer of the multilayer reflective film was a Si layer.

Next, a protective film was formed on the multilayer reflective film by the ion beam sputtering method.

The protective film was a Ru layer, and the ion beam sputtering was performed using a Ru target under an Ar gas atmosphere (gas pressure: 0.02 Pa). An applied voltage was set to 700 V, and a deposition rate was set to 3.12 nm/min. A film thickness of the protective film was set to 2.5 nm.

Next, an absorber film was formed on the protective film by the magnetron sputtering method.

The absorber film was a TaN layer, and the magnetron sputtering was performed using a Ta target under an atmosphere of a mixed gas of Kr and $N_2$ (Kr=95 vol % and $N_2$=5 vol %). A deposition rate was set to 7.7 nm/min, and a film thickness was set to 75 nm.

Accordingly, Sample 1 for evaluating properties of the absorber film of the reflective mask blank in Case 1 was obtained.

Next, a low reflective layer was formed on the absorber film by the magnetron sputtering method.

The low reflective layer was a TaON layer, and the magnetron sputtering was performed using a Ta target under an atmosphere of a mixed gas of Ar, $O_2$ and $N_2$ (Ar=60 vol %, $O_2$=30 vol %, and $N_2$=10 vol %). A deposition rate was set to 1.32 nm/min. A film thickness of the low reflective layer was set to 5 nm.

Accordingly, the reflective mask blank in Case 1 was manufactured.

(Case 2)

The reflective mask blank was manufactured by the same method as that of Case 1.

However, in this Case 2, the conditions for forming the TaN layer as the absorber film by the magnetron sputtering method was changed from those of Case 1. More specifically, a mixing ratio (volume ratio) of Kr and $N_2$ in the mixed gas was set to 93:7. The other conditions are the same as those of Case 1.

As with Case 1, a sample for evaluating the properties of the absorber film of the reflective mask blank including the formed absorber film was obtained. The sample is referred to as "Sample 2" (the same applies hereinafter).

(Case 3)

The reflective mask blank was manufactured by the same method as that of Case 1.

However, in this Case 3, the conditions for forming the TaN layer as the absorber film by the magnetron sputtering method was changed from those of Case 1. More specifically, a mixing ratio (volume ratio) of Kr and $N_2$ in the mixed gas was set to 91:9. The other conditions are the same as those of Case 1.

(Case 4)

The reflective mask blank was manufactured by the same method as that of Case 1.

However, in this Case 4, the conditions for forming the TaN layer as the absorber film by the magnetron sputtering method was changed from those of Case 1. More specifically, a mixing ratio (volume ratio) of Kr and $N_2$ in the mixed gas was set to 89:11. The other conditions are the same as those of Case 1.

(Case 5)

The reflective mask blank was manufactured by the same method as that of Case 1.

However, in this Case 5, the conditions for forming the TaN layer as the absorber film by the magnetron sputtering method was changed from those of Case 1. More specifically, a mixed gas of Ar, Kr and $N_2$ was used as the mixed gas. A mixing ratio (volume ratio) of Ar, Kr and $N_2$ was set to 54:38:8. The other conditions are the same as those of Case 1.

(Case 6)

The reflective mask blank was manufactured by the same method as that of Case 1.

However, in this Case 6, the conditions for forming the TaN layer as the absorber film by the magnetron sputtering method was changed from those of Case 1. More specifically, a mixed gas of Ar, Kr and $N_2$ was used as the mixed gas. A mixing ratio (volume ratio) of Ar, Kr and $N_2$ was set to 67:17:16. The other conditions are the same as those of Case 1.

(Case 7)

The reflective mask blank was manufactured by the same method as that of Case 1.

However, in this Case 7, the conditions for forming the TaN layer as the absorber film by the magnetron sputtering method was changed for those of Case 1. More specifically, a mixing ratio (volume ratio) of Kr and $N_2$ in the mixed gas was set to 94:6. The other conditions are the same as those of Case 1.

(Evaluation)

The following evaluations were made by use of each sample manufactured as described above.

(XRD Measurement)

An X-ray diffraction device (model: ATX-G, manufacturer: Rigaku Corporation) was used to perform XRD measurement using an in-plane method. In the measurement, a position where a width limit slit of 1 mm and a vertical limit slit of 10 mm were overlapped and a position where a width limit slit of 0.1 mm and a vertical limit slit of 10 mm were overlapped was arranged at two positions from an incident side of X-rays, and a solar slit with a divergence angle of 0.48 degree was arranged therebetween. A solar slit with a divergence angle of 0.41 degree was arranged on a light receiving side. The measurement was performed using Cu—Kα rays (wavelength: 1.5418 Å) at an output of 50 kV and 300 mA as an X-ray source under the conditions of an incident angle of 0.6 degree, a step width of 0.05 degree, and a scanning speed of 1 degree/min, thereby obtaining data.

X-ray analysis software (model: PDXL2, manufacturer: Rigaku Corporation) was used for analysis of the measurement data. Data process of B-Spline smoothing (X threshold: 1.50), background removal (a fitting method), Kα2 removal (intensity ratio: 0.497), peak search (second derivative method, σ cut value: 3.00), and profile fitting (fitting to measured data, peak shape: split type Voigt function) was performed to obtain the diffraction angle 2θ and the full width at half maximum.

Figure 2:
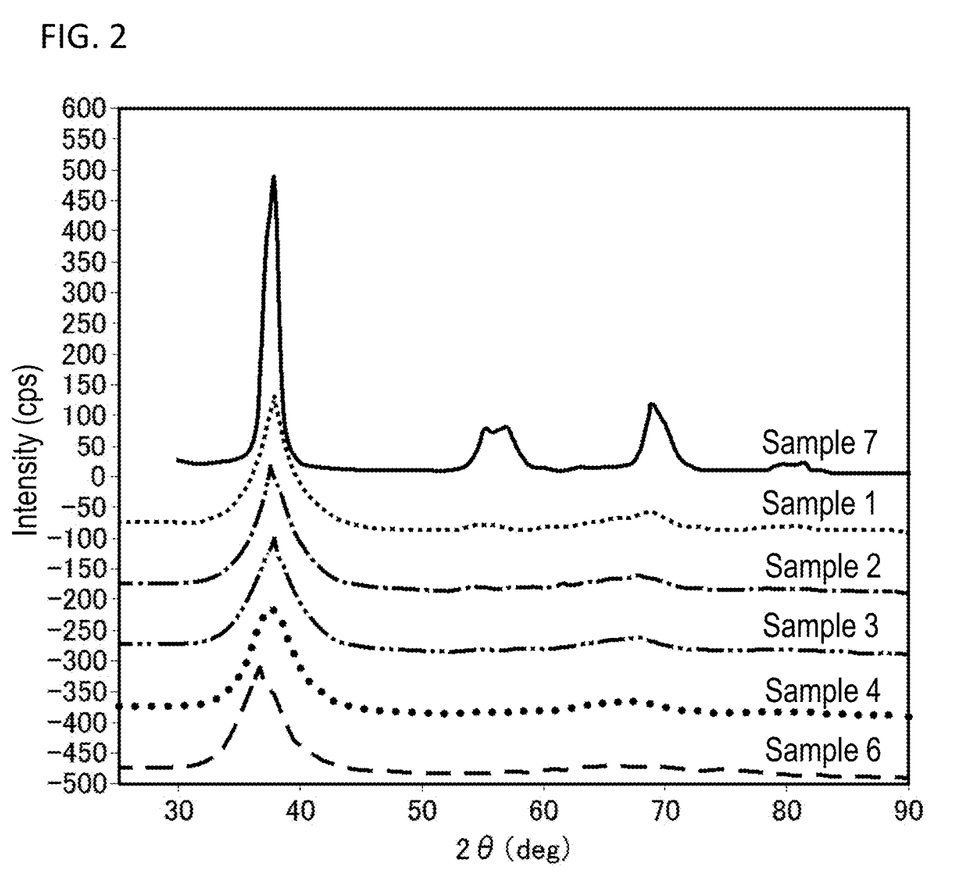
FIG. 2 is a graph showing X-ray diffraction patterns of Samples 1 to 4 and Samples 6 and 7.

FIG. 2 is a graph showing X-ray diffraction patterns of Samples 1 to 4 and Samples 6 and 7. In FIG. 2, a fixed value is added to an intensity (cps) value of the X-ray diffraction peak of each sample to shift the intensity of the X-ray diffraction peak of each sample, so that it is easy to observe a peak shape. Therefore, a scale on a vertical axis is not an absolute value of the intensity but mere intensity (cps).

(Etching Rate Evaluation)

Reactive ion etching was performed using an etching device (model: CE-300R, manufacturer: ULVAC Inc.) under an atmosphere of a mixed gas of $Cl_2$ and He ($Cl_2$=20 vol %, He=80 vol %). Then, film thicknesses (nm) of the absorber film and the protective film after etching were measured using an X-ray reflectance measuring device (model: Smart-Lab HTP, manufacturer: Rigaku Corporation), thereby obtaining the etching rates (nm/min) of the absorber film and the protective film. The etching selectivity was obtained from the etching rate of the absorber film with respect to the etching rate of the protective film (etching rate of absorber film/etching rate of protective film). The etching rate of the protective film is 0.047 nm/sec in each case.

(Film Composition Evaluation)

An amount of Ta (at %), an amount of N (at %) and an amount of Kr (at %) in the absorber films of Samples 1 to 7 were obtained using a Rutherford backscattering analyzing device (model: RBS, manufacturer: Kobelco Research Institute). Further, since values of the amounts of N in the films of Samples 1 to 3 and 7 were small, the amount could not be quantitatively evaluated with high accuracy by the Rutherford backscattering analyzing device. Therefore, the amount of Ta (at %) and the amount of N (at %) were measured using an electron beam microanalyzer (model: JXA-8500F, manufacturer: JEOL Ltd.). In the measurement by the electron beam microanalyzer, an acceleration voltage was set to 4 kV, an irradiation current was set to 30 nA, and a beam diameter was set to 100 μm, and Kα ray was measured for N by using LDE1H as an analyzing crystal of N, and Ma ray was measured for Ta by using PETJ as an analyzing crystal of Ta. The amount of Ta (at %) and the amount of N (at %) were quantified by a calibration curve method, standardized to be 100 wt % with Ta and N, and then were converted into at %. As a standard sample, Sample 4 in which the amount of N (at %) was determined by Rutherford backscattering analysis and a Ta film containing no N were used.

(Defect Inspection)

Defect inspection was performed on each sample in the following procedures.

Figure 3:
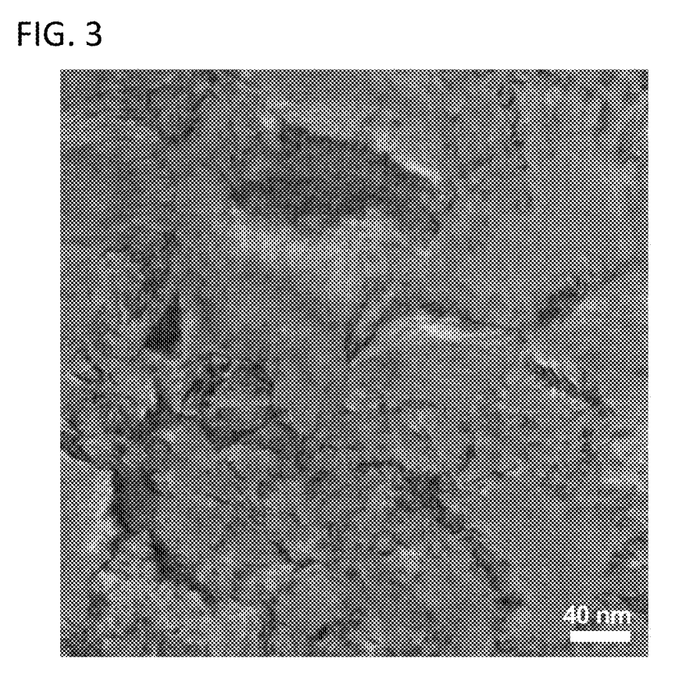
FIG. 3 shows a TEM observation result of Sample 7.
Figure 4:
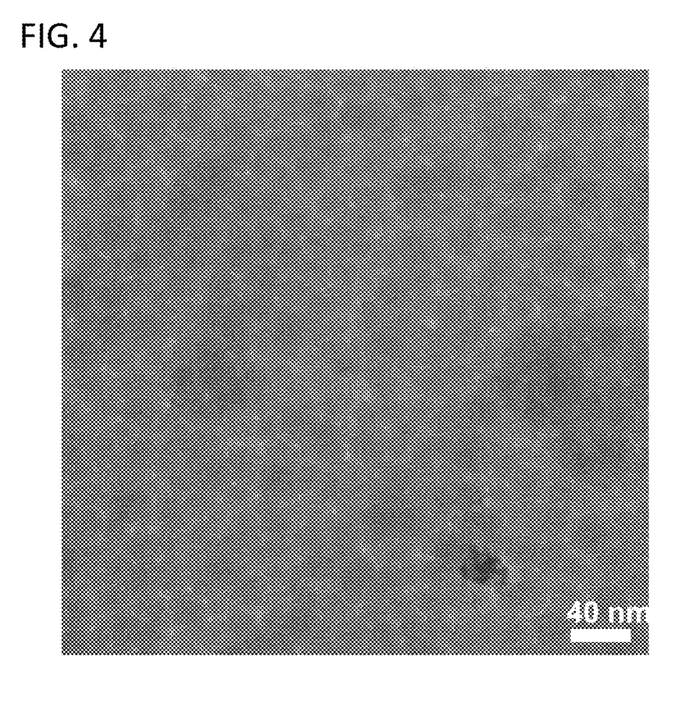
FIG. 4 shows a TEM observation result of Sample 4.

A defect inspection device using visible light laser (model: M1350, manufacturer: Lasertec) was used to perform the defect inspection on a surface on an absorption layer side of each sample. An evaluation region was set to a range of 132 mm×132 mm.

mission electron microscope (model: JEM-2010F, manufacturer: JEOL Ltd.) at an acceleration voltage of 200 kV. FIG. 3 shows a TEM observation result of Sample 7, and FIG. 4 shows a TEM observation result of Sample 4. It can be seen that a surface of Sample 7 is remarkably rough.

Further, under the same conditions as those of Example 1, samples having film thicknesses of 50 nm and 58 nm were manufactured and evaluated, respectively. As a result, the performance was the same as that of Sample 1.

The results are shown in the following table.

TABLE 1

|  | Deposition gas flow (vol %) | | | Film thickness of absorber film |
| --- | --- | --- | --- | --- |
|  | Ar | Kr | $N_2$ | (nm) |
| Sample 1 | 0% | 95% | 5% | 75 |
| Sample 2 | 0% | 93% | 7% | 76 |
| Sample 3 | 0% | 91% | 9% | 76 |
| Sample 4 | 0% | 89% | 11% | 76 |
| Sample 5 | 54% | 38% | 8% | 75 |
| Sample 6 | 67% | 17% | 16% | 76 |
| Sample 7 | 0% | 94% | 6% | 77 |

TABLE 2

|  | Full width at half maximum (deg) | Diffraction angle (deg) | N in absorber film (at %) | Kr in absorber film (at %) | Etching Rate of Absorber film (nm/sec) | Etching Selectivity | Inspectability |
| --- | --- | --- | --- | --- | --- | --- | --- |
| Sample 1 | 3.5 | 37.2 | 11.7 | 0.07 | 3.50 | 75.10 | A |
| Sample 2 | 4.2 | 37.1 | 14.6 | 0.07 | 3.19 | 68.40 | A |
| Sample 3 | 4.6 | 37.2 | 16.8 | 0.07 | 2.74 | 58.74 | A |
| Sample 4 | 4.5 | 37.1 | 18.3 | 0.07 | 2.32 | 49.62 | A |
| Sample 5 | 4.4 | 37.1 | 21.9 | 0.07 | 2.25 | 48.28 | A |
| Sample 6 | 4.4 | 36.6 | 39.4 | 0.10 | 1.25 | 26.82 | A |
| Sample 7 | 1.3 | 37.8 | 9.5 | 0.10 | 2.77 | 59.28 | B |

In Sample 7, in the inspection with the defect inspection device, 500 or more defects of 100 nm or less was detected, but when the surface was observed with a scanning electron microscope (model: Ultra 60, manufacturer: Carl Zeiss), there were no defects actually, and no real defects were confirmed. For this reason, those detected as the defects of 100 nm or less by the defect inspection device were found to be false defects due to the surface roughness. Presence of such false defects hinders accurate evaluation of real defects.

Inspectability of samples, in which many false defects were detected and accurate defect inspection was difficult, was determined as B. Meanwhile, inspectability of samples, for which the accurate defect inspection can be can performed, was determined as A.

Sample 4 and Sample 7 were observed by TEM in the following procedures.

A sample for TEM (hereinafter also referred to as a transmission electron microscope) observation was obtained by polishing the substrate side on which the absorber film was formed and preparing a thin sample of only the absorber film. A mechanical polishing machine (model: Beta Grinder Polisher, manufacturer: Burea) and an ion polishing machine (model: Precision Ion Polishing System Model 691, manufacturer: Gatan) were used for the polishing of the substrate side. The thin sample of only the absorber film was observed from a planar direction of the absorber film using a trans- In any of Samples 1 to 5, the etching rate during the dry etching process of the absorber film with chlorine gas was high and the etching selectivity between the absorber film and the protective film was high. In contrast, in Sample 6 with a diffraction angle 2θ of less than 36.8 degrees, the etching rate during the dry etching process of the absorber film with chlorine gas was small and the etching selectivity between the absorber film and the protective film was low. Meanwhile, in Sample 7 with a full width at half maximum of less than 1.5 degrees, as shown in FIG. 3, coarse crystal grains were formed on a surface of the absorber film. Further, the evaluation result of inspectability for Sample 7 was determined as B. In any one of Samples 1 to 7, a value of the EUV reflectance around 13.5 nm was 1.5% or less, and the EUV absorption properties required for the absorber film were satisfied.

While the present invention has been described in detail and with reference to specific embodiments thereof, it will be apparent to one skilled in the art that various changes and modifications can be made therein without departing from the spirit and scope thereof.

This application is based on Japanese Patent Application No. 2017-155403 filed on Aug. 10, 2017 and Japanese Patent Application No. 2017-182146 filed on Sep. 22, 2017, the entire subject matters of which are incorporated herein by reference.

DESCRIPTION OF REFERENCE NUMERALS

1 EUV mask blank
11 Substrate
12 Reflective layer (multilayer reflective film)
13 Protective film
14 Absorber film
15 Backside conductive film

The invention claimed is:

1. A reflective mask blank comprising, on/above a substrate in the following order from the substrate side:
a multilayer reflective film which reflects EUV light; and
an absorber film which absorbs FUN light,
wherein the absorber film is a tantalum-based material film comprising a tantalum-based material, where the tantalum-based material film comprises 0.05 at % or more of Krypton atoms and 10.0 at % to 18.0 at % of nitrogen atoms, and
wherein the absorber film provides a peak derived from the tantalum-based material in an X-ray diffraction pattern, the peak having a peak diffraction angle (2θ) of 36.8 degrees or more and a full width at half maximum of 1.5 degrees or more.

2. The reflective mask blank according to claim 1, wherein the tantalum-based material film comprises 11.0 at % to 16.0 at % of nitrogen atoms.

3. The reflective mask blank according to claim 2, comprising a protective film on the multilayer reflective film, wherein etching selectivity between the absorber film and the protective film is 45 or more in a dry etching process with a chlorine gas.

4. The reflective mask blank according to claim 3, wherein the protective film is a ruthenium-based material film comprising a ruthenium-based material.

5. A reflective mask obtained by forming a pattern in the absorber film of the reflective mask blank accordion to claim 3.

6. A reflective mask obtained by forming a pattern in the absorber film of the reflective mask blank according to claim 2.

7. The reflective mask blank according to claim 1, comprising a protective film on the multilayer reflective film, wherein etching selectivity between the absorber film and the protective film is 45 or more in a div etching process with a chlorine gas.

8. The reflective mask blank according to claim 7, wherein the protective film is a ruthenium-based material film comprising a ruthenium-based material.

9. A reflective mast obtained by forming a pattern in the absorber film of the reflective mask blank according to claim 7.

10. A reflective mask obtained by forming a pattern in the absorber film of the reflective mask blank according to claim 1.

* * * * *